(12) United States Patent
Angerer et al.

(10) Patent No.: US 7,228,323 B2
(45) Date of Patent: Jun. 5, 2007

(54) HIS DATA COMPRESSION

(75) Inventors: Walter Angerer, Maple Grove, MN (US); Rebecca Evans, Maple Grove, MN (US); Eckhard Kaul, Maple Grove, MN (US); Petar Ristanovic, Maple Grove, MN (US)

(73) Assignee: Siemens Aktiengesellschaft, Munich ( * ) Notice: Subject to any disclaimer, the term of this patent is extended or adjusted under 35 U.S.C. 154(b) by 555 days.

(21) Appl. No.: 10/858,965

(22) Filed: Jun. 2, 2004

(65) Prior Publication Data
US 2005/0007845 A1    Jan. 13, 2005

Related U.S. Application Data

(60) Provisional application No. 60/477,210, filed on Jun. 10, 2003.

(51) Int. Cl.
*G06F 7/00* (2006.01)
(52) U.S. Cl. ...................................... 708/203
(58) Field of Classification Search ................. 708/203
See application file for complete search history.

(56) References Cited

U.S. PATENT DOCUMENTS 5,774,385 A * 6/1998 Bristol ....................... 708/203

OTHER PUBLICATIONS

PCT International Search Report, mailed Dec. 9, 2004.

Patent Cooperation Treaty (Written Opinion of the International Searching Authority).

Foley, J.D. et al.: << Bresenham's Line Algorithm >> ; Electrochemistry Proceedings of the First Conference held in Sydney, Feb. 13-15 and Hobart Feb. 18-20, 1963; Proceedings of Conf. on Electrochemistry, Oxford, Pergamon Press, GB, vol. PROC. 1963, pp. 433-436; XP000563829.

(Continued)

*Primary Examiner*—Tan V. Mai

(57) ABSTRACT

Certain exemplary embodiments comprise a method for transforming a raw set of electrical power generation process data associated with a first physical storage space into a representation of the raw set. The representation of the raw set can be associated with a second physical storage space that is smaller than the first physical storage space. The method can comprise receiving a non-zero user-specified deviation metric relating to the raw set of electrical power generation process data. The method can comprise automatically calculating a deviation measure of at least three data points from the raw set, the at least three data points comprising an opposing pair of end points. The method can comprise automatically comparing the deviation measure to the deviation metric. The method can comprise automatically deleting all data points intermediate to the opposing pair of end points if the deviation measure does not exceed the deviation metric. The method can comprise automatically storing the opposing pair of end points in a compressed set at least partially representative of the raw set. The compressed set can be stored in an Oracle table on a memory device.

26 Claims, 6 Drawing Sheets

OTHER PUBLICATIONS

Davisson, L.D.: "Data Compression Using Straight Line Interpolation"; IEEE Transactions on Information Theory, IEEE Inc., NY, USA, vol. 3, No. IT-14, May 1968, pp. 390-394, XP001073864.

Braun, H. et al. "Network Control and Load Allocation for Power Supplies", Etz, Germany, vol. 115, No. 5, Mar. 1994, pp. 248-253; XP002305605.

Chunsheng, Li, et al., "An Agent-Based Curve-Digitizing System for Well-Logging Data Management", Proceedings ITCC'03, Apr. 28, 2003, pp. 656-660, XP010638698.

Martonossy, L. et al., "Image Compression in Szote-Pacs (picture archiving and communication system) in Szeged", ITI'99 Proceedings of the 21$^{st}$ Int'l Conf. on Information Tech. Interfaces Univ., Zagreb Zagreb, Croatia, Jun. 1999, pp. 305-310, XP008038913.

Charczuk, J., "Physical Structure in Design for Relational Databases", Advances in Databases and Information Systems, 2$^{nd}$ E. Europ. Symposium, Adbis '98: Proceedings Springer-Verlag, Berlin, Germany, Sep. 1998, pp. 357-362, XP008038919.

Breaux, J.N. A Maximum r.m.s. Error Comparison of Several Redundancy Reduction Techniques, National Telemetering Conf. IEEE, NY, NY, USA, 1969, pp. 172-175, XP008038455, Whole document.

\* cited by examiner

4000

HIS DATA COMPRESSION

CROSS-REFERENCES TO RELATED APPLICATIONS

This application claims priority to, and incorporates by reference herein in its entirety pending U.S. Provisional Patent Application Ser. No. 60/477,210, filed 10 Jun. 2003.

SUMMARY

Certain exemplary embodiments comprise a method for transforming a raw set of electrical power generation process data associated with a first physical storage space into a representation of the raw set. The representation of the raw set can be associated with a second physical storage space that is smaller than the first physical storage space. The method can comprise receiving a non-zero user-specified deviation metric relating to the raw set of electrical power generation process data. The method can comprise automatically calculating a deviation measure of at least three data points from the raw set, the at least three data points comprising an opposing pair of end points. The method can comprise automatically comparing the deviation measure to the deviation metric. The method can comprise automatically deleting all data points intermediate to the opposing pair of end points if the deviation measure does not exceed the deviation metric. The method can comprise automatically storing the opposing pair of end points in a compressed set at least partially representative of the raw set. The compressed set can be stored in an Oracle table on a memory device.

BRIEF DESCRIPTION OF THE DRAWINGS

A wide variety of potential embodiments will be more readily understood through the following detailed description, with reference to the accompanying drawings in which.

DEFINITIONS

Figure 1:
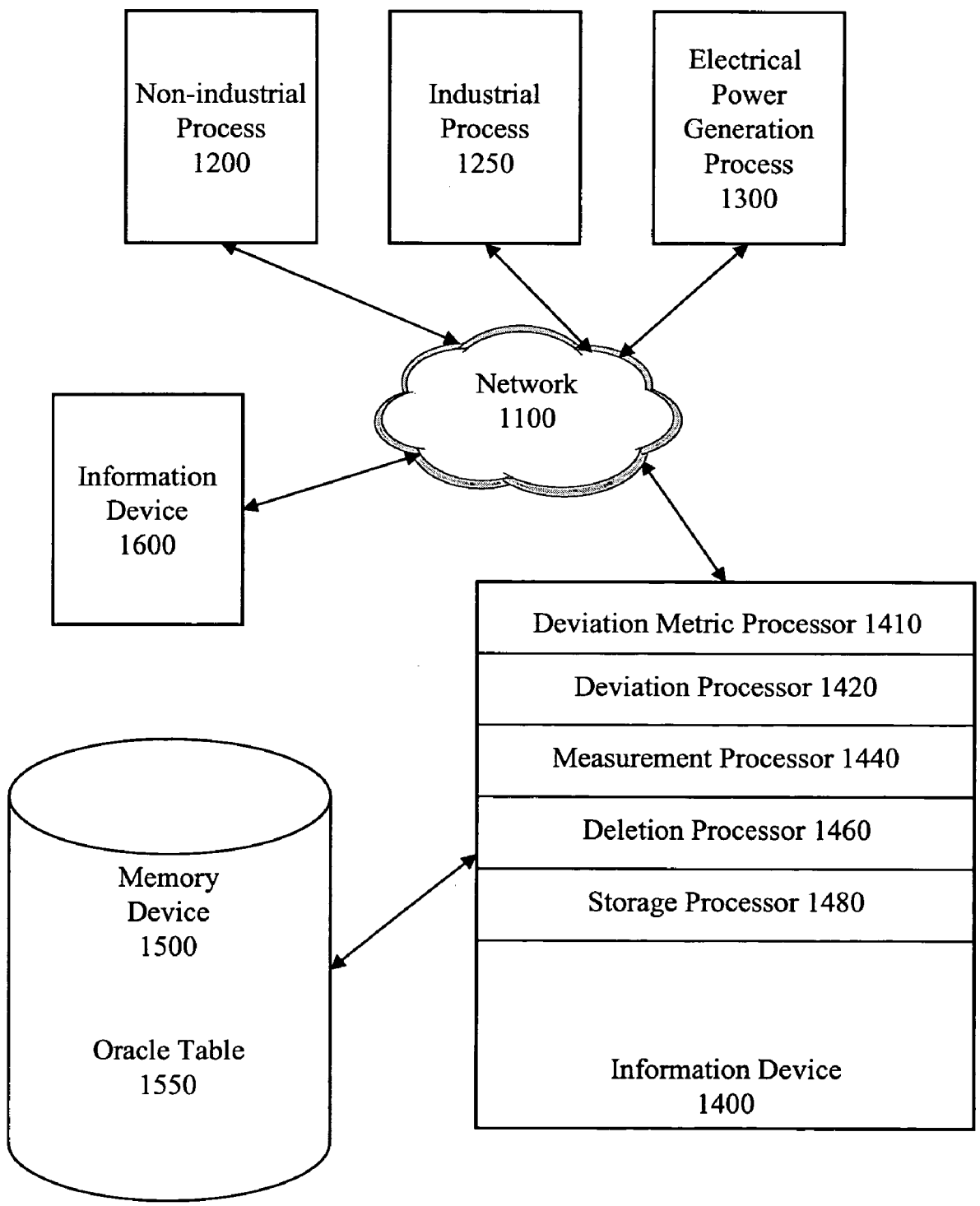
FIG. 1 is a block diagram of an exemplary embodiment of a process data management system 1000.

When the following terms are used herein, the accompanying definitions apply:

artificial—simulated.
automatic—performed via an information device in a manner essentially independent of influence or control by a user.
average—a value obtained by dividing the sum of a set of quantities by the number of quantities in a set.
compress—to transform data to a representation that has a reduced number of bytes with respect to the untransformed data.
connecting—intersecting.
data—distinct pieces of information.
database—a structured collection of data. A database comprises a group of records, each record containing related data that are stored in pre-defined fields.
deviation—a distance from a data point to a line connecting end points of a set comprising the data point.
deviation metric—a value that describes a maximum allowable distance from a data point to a line connecting end points of a set comprising the data point.
electrical power generation—relating to producing electricity.
end point—a first or last element in a sequence of data.
extrapolate—to extend.
field—a storage space for a type of data. Fields contain textual, numeric, date, graphical, audio, video, and/or calculated data. Any text field has properties comprising a fixed or variable length, a pre-defined display format, and/or relatability to another field.
firmware—machine-readable instructions that are stored in a read-only memory (ROM). ROM's can comprise PROMs, EPROMs, etc.
haptic—both the human sense of kinesthetic movement and the human sense of touch. Among the many potential haptic experiences are numerous sensations, body-positional differences in sensations, and time-based changes in sensations that are perceived at least partially in non-visual, non-audible, and non-olfactory manners, including the experiences of tactile touch (being touched), active touch, grasping, pressure, friction, traction, slip, stretch, force, torque, impact, puncture, vibration, motion, acceleration, jerk, pulse, orientation, limb position, gravity, texture, gap, recess, viscosity, pain, itch, moisture, temperature, thermal conductivity, and thermal capacity.
index organized—a table comprising data in an index associated with the table. Changes to the table data, such as adding new rows, updating rows, or deleting rows, result in updating the index.
indicator—a sign or token.
information device—any device capable of processing information, such as any general purpose and/or special purpose computer, such as a personal computer, workstation, server, minicomputer, mainframe, supercomputer, computer terminal, laptop, wearable computer, and/or Personal Digital Assistant (PDA), mobile terminal, Bluetooth device, communicator, "smart" phone (such as a Handspring Treo-like device), messaging service (e.g., Blackberry) receiver, pager, facsimile, cellular telephone, a traditional telephone, telephonic device, a programmed microprocessor or microcontroller and/or peripheral integrated circuit elements, an ASIC or other integrated circuit, a hardware electronic logic circuit such as a discrete element circuit, and/or a programmable logic device such as a PLA, FPGA, PAL, etc. In general any device on which resides a state machine capable of implementing at least a portion of a method, structure, and/or or graphical user interface described herein may be used as an information device. An information device can include well-known components such as one or more network interfaces, one or more processors, one or more memories containing instructions, and/or one or more input/output (I/O) devices, one or more user interfaces, etc.
input—a signal, data, and/or information provided to a processor.
integral value—a summation of a plurality of data points.
intermediate—occurring between two an opposing pair of end points.

Internet—a globally interconnected system of data networks.

I/O device—any sensory-oriented input and/or output device, such as an audio, visual, haptic, olfactory, and/or taste-oriented device, including, for example, a monitor, display projector, overhead display, keyboard, keypad, mouse, trackball, joystick, gamepad, wheel, touchpad, touch panel, pointing device, microphone, speaker, video camera, camera, scanner, printer, haptic device, vibrator, tactile simulator, and/or tactile pad, potentially including a port to which an I/O device can be attached or connected.

key—a field usable to sort and/or search data. A "key" can also be called a key field, sort key, search key, index, and/or key-word. For example, if records are sorted by age, then the age field is a key. Most database standards allow more than one key so that records are sortable in different ways. One of the keys is designated the primary key, and must hold a unique value for each record. A key field that identifies records in a different table is called a foreign key.

maximum value—out of a sequence of data points, the data point having the largest magnitude as measured along the non-time axis.

measure—a quantity ascertained by comparison with a standard.

memory device—any device capable of storing analog or digital information, for example, a non-volatile memory, volatile memory, Random Access Memory, RAM, Read Only Memory, ROM, flash memory, magnetic media, a hard disk, a floppy disk, a magnetic tape, an optical media, an optical disk, a compact disk, a CD, a digital versatile disk, a DVD, and/or a raid array, etc. The memory can be coupled to a processor and can store instructions adapted to be executed by the processor according to an embodiment disclosed herein.

minimum acceptable time—a defined interval for a separation of points with respect to time. The defined interval can relate to the receipt, collection, evaluation, and/or storage, etc. of the points.

minimum value—out of a sequence of data points, the data point having the smallest magnitude as measured along the non-time axis.

network—a coupling of two or more information devices that can allow the devices to share resources (such as printers or CD-ROMs), exchange files, and/or allow electronic communications therebetween. Information devices on a network can be linked through various wireline or wireless media, such as cables, telephone lines, power lines, optical fibers, radio waves, light beams, etc.

network interface—any device, system, or subsystem capable of coupling an information device to a network. For example, a network interface can be a telephone, cellular phone, cellular modem, telephone data modem, fax modem, wireless transceiver, ethernet card, cable modem, digital subscriber line interface, bridge, hub, router, or other similar device.

number—count.

opposing pair of end points—a first data point in time of a sequence of data points and a last data point in time of a sequence of data points.

Oracle—an industry standard for relational database formatting and structure.

ordinal—a non-time coordinate of a data point.

particular—specific.

physical—tangible.

point—a measurement or representation of a measurement having a time coordinate and a non-time coordinate.

preprocess—analyzing and/or modifying data points prior to storage.

process—a series of actions, changes, or functions bringing about a result.

process data—information related to an application.

processor—a hardware and/or software machine and/or virtual machine comprising a set of machine-readable instructions adaptable to perform a specific task. A processor comprises any one or combination of hardware, firmware, and/or software adaptable to perform a specific task. A processor acts upon information by manipulating, analyzing, modifying, converting, transmitting the information to an information device, and/or routing the information to an output device.

raw set—a series of data points representative of information obtained from measurement devices.

recursive—repetitive.

relate—to connect to and/or associate with.

represent—to be considered as an acceptable equivalent of.

sequential—ordered in time.

significant digits—the digits of the decimal form of a number beginning with the leftmost nonzero digit and extending to the right to include a predetermined number of digits, such as a number of digits warranted by the accuracy of measuring devices used to obtain the numbers and/or a user-specified number of digits, etc.

slope—with respect to a first point and a second point that are intersected by a straight line, a ratio of the change in the ordinal value from the first point to the second point, to the change in the abscissal value from the first point to the second point.

statistical parameter—a calculated value related to a plurality of data points. Examples include an average, mean, median, mode, minimum, maximum, integral, local minimum, weighted average, etc.

successive—in consecutive order in time.

table—data arranged in physical and/or logical rows and columns.

transform—change.

user—any person, organization, process, device, program, protocol, and/or system that uses a device and/or service.

user interface—any device for rendering information to a user and/or requesting information from the user. A user interface includes at least one of textual, graphical, audio, video, animation, and/or haptic elements.

user-specified—stated, provided, and/or determined by a user.

DETAILED DESCRIPTION

FIG. 1 is a block diagram of an exemplary embodiment of a process data management system 1000, which in certain exemplary embodiments can be adapted to collect, compress, and store process data. In certain exemplary embodiments, a raw set of data can be collected from a process such as, for example, a non-industrial process 1200, an industrial process 1250, and/or an electrical power generation process 1300. The raw set of data can be associated with a first physical storage space. Compressing the raw set of data can create a representation of the raw set of data, the representation associated with a second physical storage space that is smaller than the first physical storage space.

Certain exemplary embodiments can comprise a network 1100. Network 1100 can be public, private, circuit-switched, packet-switched, virtual, radio, telephone, cellular, cable, DSL, satellite, microwave, AC power, twisted pair, ethernet, token ring, a LAN, a WAN, the Internet, an intranet, wireless, Wi-Fi, BlueTooth, Airport, 802.11a, 802.11b, 802.11g, etc., and/or any equivalents thereof.

Network 1100 can communicatively couple processes such as non-industrial process 1200, industrial process 1250, and/or electrical power generation process 1300 to information devices such as an information device 1400 and/or an information device 1600. Non-industrial process 1200 can comprise systems adapted for use in, for example, residential security, business security, residential HVAC, business HVAC, vehicular monitoring, and/or medical monitoring, etc. Industrial process 1250 can comprise systems adapted for use in, for example, materials conveying, materials pumping, materials manufacturing, electrical power generation, heating systems, ventilating systems, air conditioning systems, chemical processing, mining, machining, packaging, and/or materials distribution, etc. Electrical power generation process 1300 can comprise a plurality of pieces of mechanical and electrical equipment. The plurality of pieces of equipment can comprise generators, pumps, combustion equipment, steam generation equipment, steam handling equipment, pipes, valves, conveyors, transformers, power lines, and/or switches, etc.

Network 1100 can communicatively couple information device 1400 to other connectable devices, such as information device 1600. Information device 1400 can comprise a deviation metric processor 1410, a deviation processor 1420, a measurement processor 1440, a deletion processor 1460, and/or a storage processor 1480. Deviation metric processor 1410 can be adaptable to receive a non-zero user-specified deviation metric relating to a raw set of electrical power generation process data. A deviation metric can be indicative of an error tolerance in compressing data. For example, in certain exemplary embodiments, certain data points can be eliminated from a set of data points responsive to calculations using the deviation metric. Data points eliminated from the set of data points can be estimated via linear interpolation between stored data points. Data points not estimable between stored data points within a tolerance related to the deviation metric can be stored rather than eliminated from the set of data.

Deviation processor 1420 can be adaptable to calculate a deviation measure of at least three data points from the raw set of electrical power generation process data. The at least three data points can comprise an opposing pair of end points. Measurement processor 1440 can be adaptable to compare the deviation measure to the deviation metric. Deletion processor 1460 can, if the deviation measure does not exceed the deviation metric, delete data points intermediate to the opposing pair of end points. Storage processor 1480 can be adaptable to store the opposing pair of end points in a table on a memory device. In certain embodiments, the table can be formatted according to specifications of software created by the Oracle Corporation of Redwood Shores, Calif., and/or the Microsoft Corporation of Redmond, Wash., etc.

Information device 1400 can be communicatively coupled to a memory device 1500. Information device 1400 can be adaptable to store a plurality of raw sets of process data relating to non-industrial process 1200, industrial process 1250, and/or electrical power generation process 1300. Memory device 1500 can be adaptable to store uncompressed and/or compressed data. Memory device 1500 can be adaptable to store databases, tables, and/or records, etc. For example, memory device 1500 can be adapted to store an Oracle table 1550.

Network 1100 can communicatively couple an information device 1600 to other information devices such as information device 1400. Information device 1600 can be adaptable to monitor statistics and/or results relating to the storage and/or compression of data storable on memory device 1500.

Figure 2:
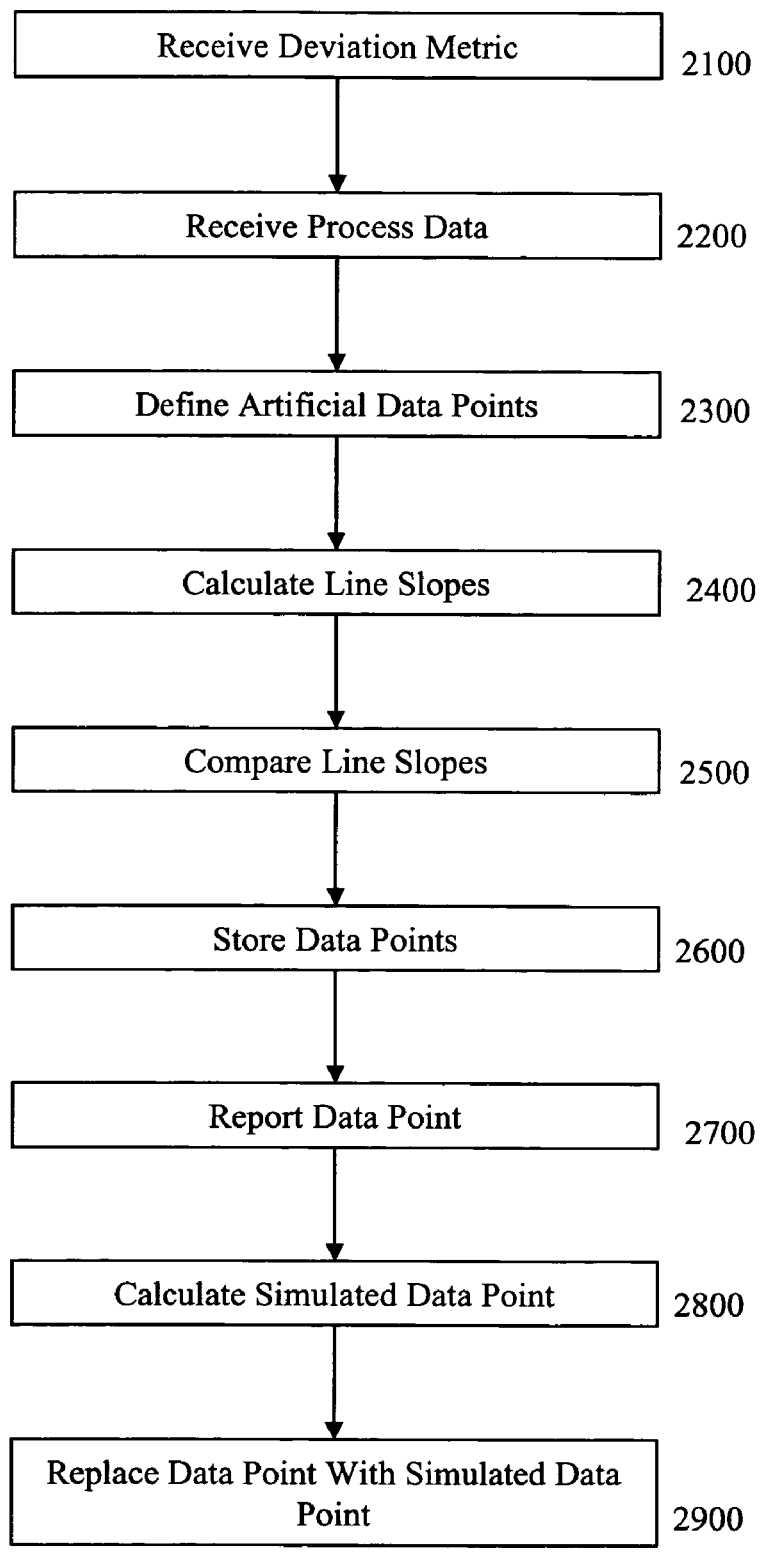
FIG. 2 is a block diagram of an exemplary embodiment of a method of compressing data from a process 2000.

FIG. 2 is a block diagram of an exemplary embodiment of a method of compressing a raw set of data related to a process 2000. The process can be an electrical power generation process. In certain exemplary embodiments, the raw set of data can be associated with a first physical storage space. Compressing the raw set of data can create a representation of the raw set of data associated with a second physical storage space that is smaller than the first physical storage space. Compressing the raw set of data related to the process can reduce a physical space needed to store a representation of the raw set of process data, reduce a time needed to access the representation of the set of process data, and/or reduce a cost associated with storing the representation of the set of process data, etc.

Compression of the raw set of data can eliminate some data points from the raw set and/or some information about the raw set. If it is later desired to create a set of data that bares a predetermined resemblance to the raw set, certain information about one or more of the deleted data points, and/or about the raw set as a whole, can be retained. For example, from a sequential viewpoint, the raw set, or a subset thereof, can have an initial data point and a final data point. These two data points can define a line that passes therethrough. Each data point intermediate to the initial data point and the final data point can be located either precisely on the line, or to either side of it. A measure of the deviation of the intermediate data point from the line can be that data point's deviation measure. The deviation measure of any number of intermediate data points can be mathematically and/or statistically quantified in numerous manners, including variance, standard deviation, correlation coefficient, etc. Some types of deviation measures are more processor- and/or time-intensive to determine than others.

If a deviation measure of one or more intermediate data points is retained, then one or more intermediate data points that have the same deviation measure can be re-generated. Each re-generated data point can be located substantially at the location of the deleted data point and/or at a location that retains predetermined mathematical and/or statistical properties of the set of data points. The locational, mathematical, and/or statistical accuracy of one or more re-generated data points versus the corresponding one or more deleted data points can depend on how the deviation measure(s) was obtained.

Returning to FIG. 2, at activity 2100, a deviation metric can be received. In certain exemplary embodiments, the deviation metric can be received from an information device. The information device can calculate the deviation metric from the raw set of process data. The information device can calculate the deviation metric based upon a regulatory requirement, statistical characteristics of the raw set of data, and/or information provided by the user, etc. The deviation metric can provide a maximum allowable deviation between a process data point and a line defined by two opposing end points. Using a deviation metric can provide a tolerance for eliminating data points in a data compression algorithm.

At activity 2200, process data can be received. In certain exemplary embodiments, process data can be received directly from a plurality of process sensors. In certain exemplary embodiments, process data can be received from an information device. Process data stored and/or received from an information device can be stored in a database compliant with standards established by Microsoft SQL, Microsoft Access, MySQL, Oracle, FileMaker, Sybase, and/or DB2, etc.

At activity 2300, artificial data points can be defined. The artificial data points can be determined from a plurality of data points from the raw set of process data. The artificial data points can be calculated by adding or subtracting the deviation metric from ordinal values of the raw set of process data. The artificial data points can be used to calculate a plurality of artificial line slopes. The plurality of artificial line slopes can be used to determine if a distance of a data point from a calculated line exceeds the deviation metric.

For example, a set of four data points can be defined by ordinal values as:

Point 1 (x1, y1)
Point 2 (x2, y2)
Point 3 (x3, y3)
Point 4 (x4, y4)

A linear approximation for data compression can cross approximately through a point such as Point 1. In certain exemplary embodiments, linear slopes can be calculated between Point 1 and respective Points 2, 3, and 4. A set of artificial data points can be defined by ordinal values as:

Artificial point 1 (x2, y1'), where y1'=y2−deviation metric
Artificial point 2 (x2, y2'), where y2'=y2+deviation metric
Artificial point 3 (x3, y3'), where y3'=y3−deviation metric
Artificial point 4 (x3, y4'), where y4'=y3+deviation metric
Artificial point 5 (x4, y5'), where y5'=y4−deviation metric
Artificial point 6 (x4, y6'), where y6'=y4+deviation metric At activity 2400, lines slopes can be calculated. Slopes can be calculated for lines defined by Point 1 and each of the artificial data points, as follows:

Slope 1=(y1'−y1)/(x2−x1)
Slope 2=(y2'−y1)/(x2−x1)
Slope 3=(y3'−y1)/(x3−x1)
Slope 4=(y4'−y1)/(x3−x1)
Slope 5=(y5'−y1)/(x4−x1)
Slope 6=(y6'−y1)/(x4−x1)

At activity 2500, line slopes can be compared. In certain exemplary embodiments, the distance of Point 3 from the calculated line between Point 1 and Point 2 exceeds the deviation metric if; either Slope 1 is greater than Slope 4 or if Slope 3 is greater than Slope 2. In certain exemplary embodiments, the distance of Point 4 from the calculated line between Point 1 and Point 3 exceeds the deviation metric if Slope 3 is greater than Slope 6 or if Slope 5 is greater than Slope 4.

At activity 2600, one or more of the data points can be stored and/or deleted from storage. In certain exemplary embodiments, if the distance of the third data point from the calculated line between Point 1 and Point 2 exceeds the deviation metric Point 1 and Point 2 can be storable in a compressed data set. In certain exemplary embodiments, if the distance of the third data point from the calculated line between Point 1 and Point 2 exceeds the deviation metric Point 1 and Point 3 can be storable in a compressed data set. If the distance of Point 3 from the calculated line between Point 1 and Point 2 is less than the deviation metric, Point 2 can be deleted from the compressed data set.

At activity 2700, a data point can be reported. In certain exemplary embodiments, the data point can be reported to an information device. In certain exemplary embodiments, the data point can be reported to a user via a user interface. In certain exemplary embodiments, the first data point and the second data point can be automatically rendered to a user via an I/O device.

At activity 2800, a simulated data point can be calculated. In certain exemplary embodiments, if the normal distance of Point 4 from the calculated line between Point 1 and Point 3 exceeds the deviation metric, a simulated ordinal value for the Point 3 can be calculated. The use of the simulated data point can improve an estimate of a re-created data point that has been previously deleted, by retaining some indication of the deviation of one or more corresponding deleted data points with respect to the line between the retained data points. The simulated ordinal value for Point 3 can be less than the deviation metric in distance from Point 3. In certain exemplary embodiments, the simulated ordinal value for Point 3 can be:

$$\text{Simulated } y3 = 0.5(\min(\text{Slope 2, Slope4}) + \max(\text{Slope 1, Slope 3}))*(x3-x1)+y1$$

At activity 2900, Point 3 can be replaced with the simulated data point. Point 3 as defined by ordinal values (x3, y3) can be replaced with Simulated Point 3 as defined by ordinal values (x3, Simulated y3). Certain exemplary embodiments can recursively analyze any number of data points in the set of data according to method 2000, and using what can be called a "sliding window" approach, can consider each successive data point for deletion in compressing the set of data. For example, in recursion, method 2000 can return to activity 2300, and data points can be re-defined by ordinal values as:

Recursive Point 1 (x2, y2) (previous Point 2)
Recursive Point 2 (x3, Simulated y3) (previous Simulated Point 3)
Recursive Point 3 (x4, y4) (next successive data point).

Method 2000 can then continue recursively (e.g., repetitively performing activities 2300 through 2900) until all data points in the set have been analyzed.

Figure 5:
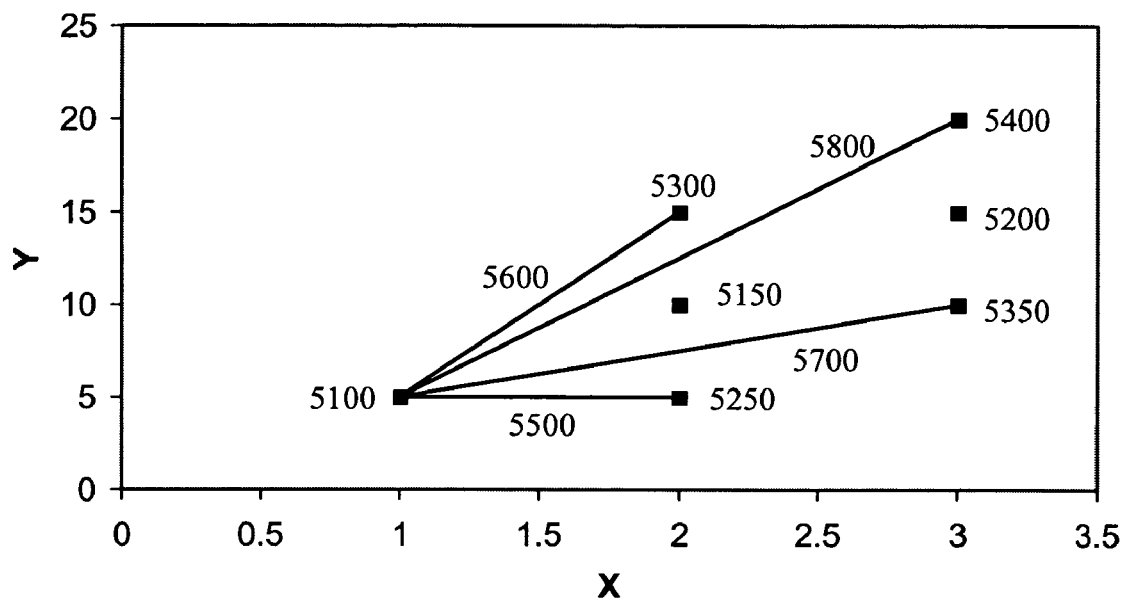
FIG. 5 is a graph representative of a sample calculation from an exemplary embodiment.

FIG. 5 is a graph representative of a sample calculation from an exemplary embodiment. For an exemplary set of data points:

Point 5100 (1, 5)
Point 5150 (2, 10)
Point 5200 (3, 15)

A deviation metric can be set at 5 for a sample calculation resulting in artificial data points of:

Artificial Data Point 5250 (2, 5)
Artificial Data Point 5300 (2, 15)
Artificial Data Point 5350 (3, 10)
Artificial Data Point 5400 (3, 20)

Slopes can be calculated as:

Slope 5500=(5−5)/(2−1)=0.0
Slope 5600=(15−5)/(2−1)=10.0
Slope 5700=(10−5)/(3−1)=2.5
Slope 5800=(20−5)/(3−1)=7.5

Graphically, Slope 5500 and Slope 5600 can be indicative of the deviation metric about a line defined by Point 5100 and Point 5150. Slope 5500 and Slope 5600 can define a first region within an acute angle defined by extending Slope 5500 and Slope 5600 from Point 5100. Slope 5700 and Slope 5800 can be indicative of the deviation metric about a line defined by Point 5100 and Point 5200. Slope 5700 and Slope 5800 can define a second region within an acute angle defined by extending Slope 5700 and Slope 5800 from Point

5100. If the first region and the second region overlap, a deviation measure related to point 5150 is less than the deviation metric. In the example shown in FIG. 5, since Slope 5500 is less than Slope 5800 and Slope 5700 is less than Slope 5600, the deviation measure related to Point 5150 is less than the deviation metric. Thus, in certain exemplary embodiments, Point 5150 can be deleted from the data set. Certain exemplary embodiments can recursively analyze any number of data points in the set of data and consider each successive data point for deletion in compressing the set of data.

Figure 6:
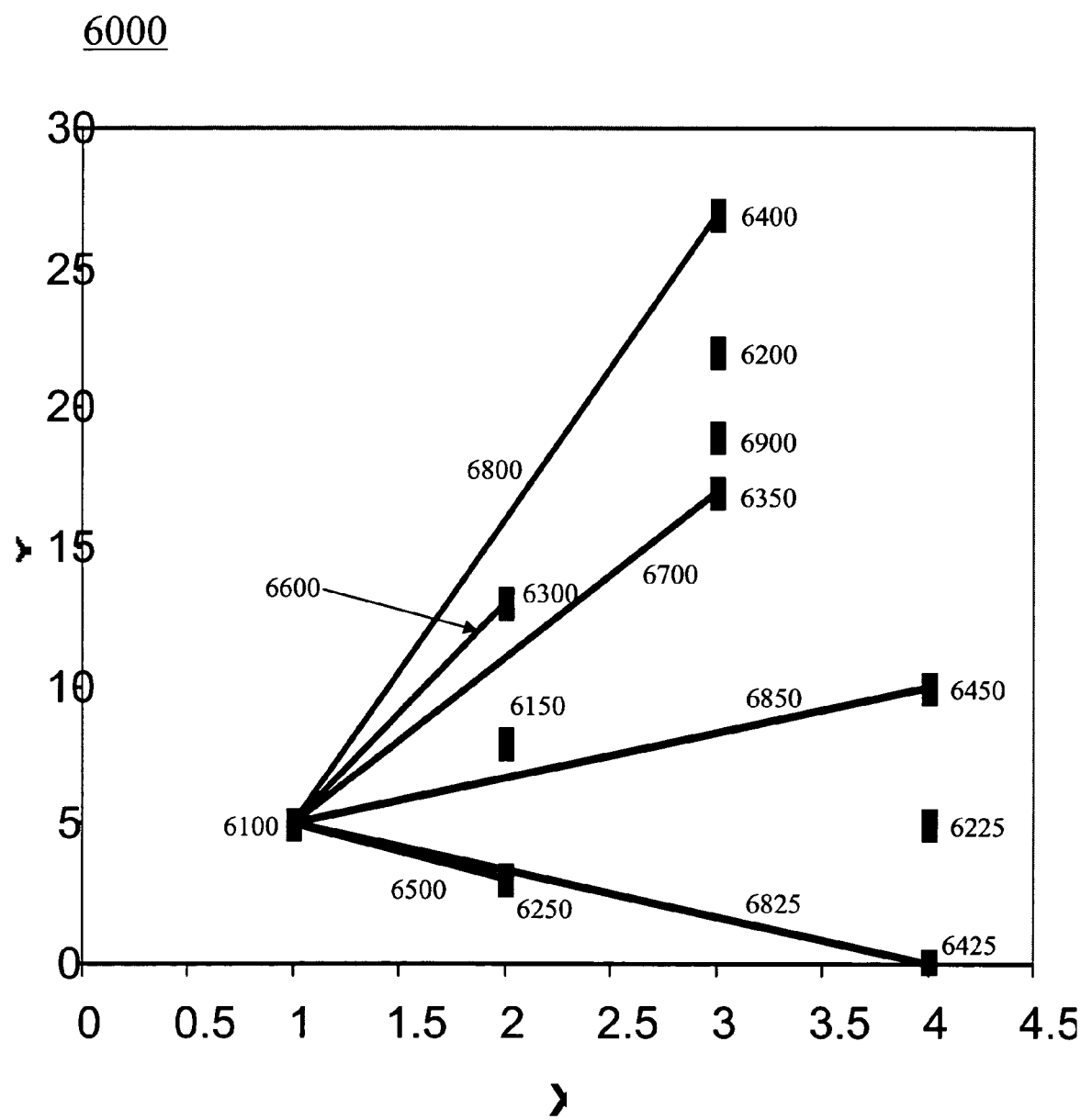
FIG. 6 is a graph representative of a sample calculation from an exemplary embodiment.

FIG. 6 is a graph representative of a sample calculation from an exemplary embodiment. An exemplary set of data points can be:
Point 6100 (1, 5)
Point 6150 (2, 8)
Point 6200 (3, 22)
Point 6225 (4, 5)
A deviation metric can be set at 5 for a sample calculation, resulting in artificial data points of:
Artificial point 6250 (2, 3)
Artificial point 6300 (2, 13)
Artificial point 6350 (3, 17)
Artificial point 6400 (3, 27)
Artificial point 6425 (4, 0)
Artificial point 6450 (4, 10)
Slopes can be calculated as:
Slope $6500=(3-5)/(2-1)=-2.0$
Slope $6600=(13-5)/(2-1)=8.0$
Slope $6700=(17-5)/(3-1)=6.0$
Slope $6800=(27-5)/(3-1)=11.0$
Slope $6825=(0-5)/(4-1)=-1.7$
Slope $6850=(10-5)/(4-1)=1.7$ Graphically, Slope 6500 and Slope 6600 can be indicative of the deviation metric about a line defined by Point 6100 and Point 6150. Slope 6500 and Slope 6600 can define a first region within an acute angle defined by extending Slope 6500 and Slope 6600 from Point 6100. Slope 6700 and Slope 6800 can be indicative of the deviation metric about a line defined by Point 6100 and Point 6200. Slope 6700 and Slope 6800 can define a second region within an acute angle defined by extending Slope 6700 and Slope 6800 from Point 6100. If the first region and the second region overlap, a deviation measure related to Point 6150 can be less than the deviation metric. In the example shown in FIG. 6, since Slope 6700 is less than Slope 6600 and Slope 6800 is greater than slope 6500, the deviation measure related to Point 6150 is less than the deviation metric. In certain exemplary embodiments, Point 6150 can be deleted from the data set.

Graphically, Slope 6825 and Slope 6850 can be indicative of the deviation metric about a line defined by Point 6100 and Point 6225. Slope 6825 and Slope 6850 can define a third region within an acute angle defined by extending Slope 6825 and Slope 6850 from Point 6100. Since Slope 6850 is less than Slope 6700, the deviation measure related to Point 6225 is greater than the deviation metric. In certain exemplary embodiments, a simulated point can replace Point 6200. A new ordinal value can be calculated as:

$$\text{Simulated } y3=0.5(8.0+6.0)*(3-1)+5=19.0$$

In certain exemplary embodiments, this presented sample calculation can result in the creation of a Simulated Point 6900. Simulated Point 6900 can replace Point 6200 in the set of data. In certain exemplary embodiments, Point 6100 and Point 6150 can be stored. In certain exemplary embodiments, Point 6150 can be deleted. In certain exemplary embodiments, calculations can be repeated recursively with Point 6225 and a first new point, wherein Simulated Point 6900 and the first new point are opposing endpoints. In certain exemplary embodiments, calculations can be repeated recursively with Point 6100, Simulated Point 6900, and Point 6225, wherein Point 6100 and Point 6225 are opposing endpoints. Certain exemplary embodiments can recursively analyze any number of data points in the set of data and consider each successive data point for deletion in compressing the set of data.

Figure 3:
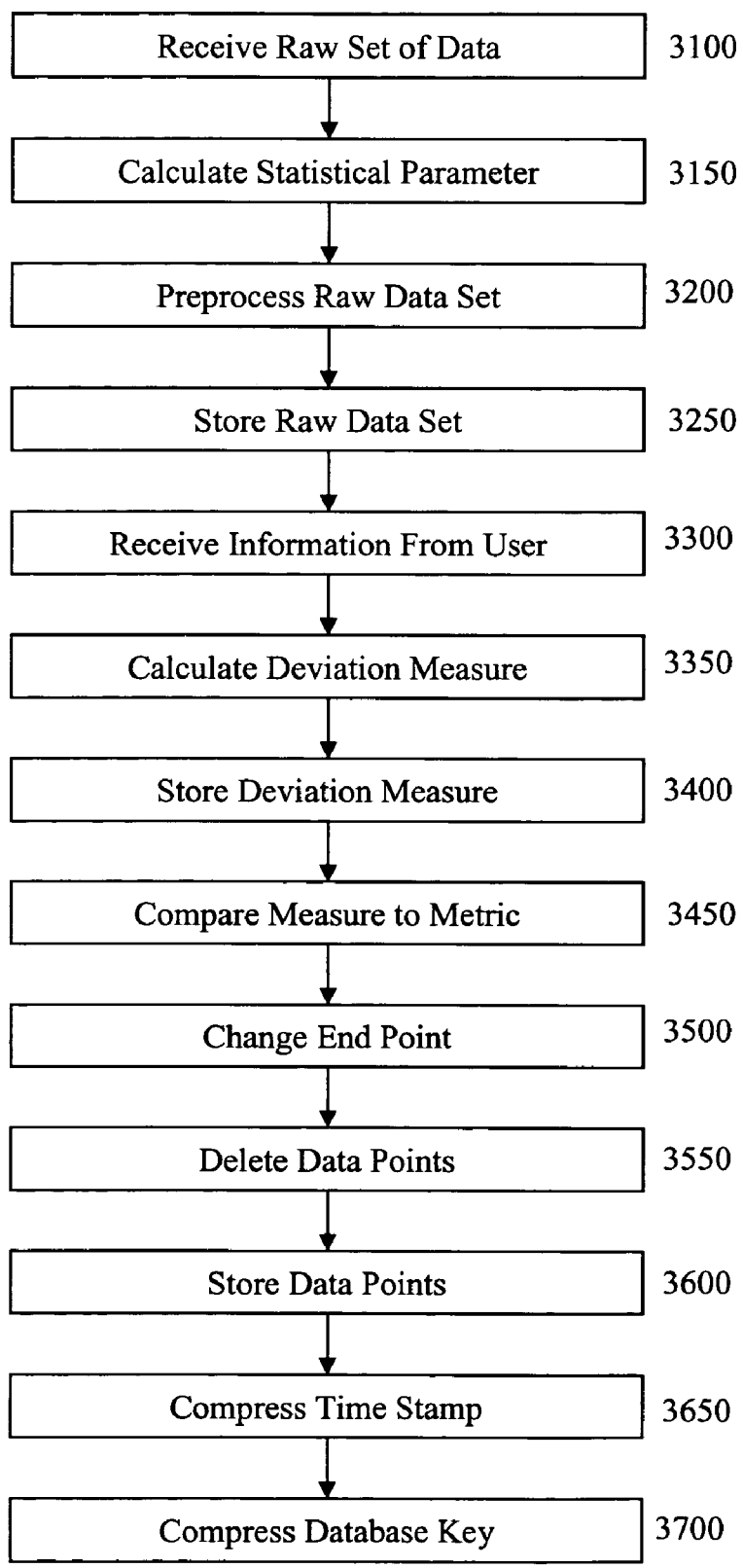
FIG. 3 is a flow diagram of an exemplary embodiment of a method of compressing data from a process 3000.

FIG. 3 is a flow diagram of an exemplary embodiment of a method of compressing data from a process 3000. At activity 3100, certain exemplary embodiments can receive a raw set of data. The raw set of data can be stored in a first Oracle table on a memory device. In certain exemplary embodiments, the raw set of data can be received directly from process instrumentation and/or a process data server. In certain exemplary embodiments, the raw set of data can be received from the first Oracle table on the memory device.

At activity 3150, certain exemplary embodiments can calculate a statistical parameter related to the raw set of data. The calculated statistical parameter can be an average, a maximum, a minimum, and/or an integral, etc. The calculated statistical parameter can be stored as an element of a compressed data set. The calculated statistical parameter can be calculated prior to data compression. Calculating statistics on the raw set of data can provide accurate information regarding the raw set of data after data is compressed. The calculated statistical parameter can be stored in a second Oracle table on the memory device.

At activity 3200, certain exemplary embodiments can preprocess the raw set of data. In certain exemplary embodiments, artificial data can be added to the raw set of data. Artificial data can be added to replace missing data points and/or data points determined to be statistical outliers.

At activity 3250, certain exemplary embodiments can store the raw set of data in a memory device. The raw set of data can be stored, for example, in a database and/or table. The database and/or table can be formatted in a manner compatible with Microsoft SQL, Microsoft Access, MYSQL, Oracle, FileMaker, Sybase, and/or DB2, etc.

At activity 3300, certain exemplary embodiments can receive information from a user. Information from a user can comprise a deviation metric adaptable for use in deleting data points linearly interpolatable between two end points. The deviation metric can provide a maximum acceptable error in estimating the value of deleted data points. In certain exemplary embodiments, the deviation metric can be calculated by an information device. The deviation metric can be stored on the memory device. The deviation metric can be storable in a table and/or database.

Information received from the user can comprise a user-specified number of significant digits storable for a particular data element from the raw set of data. Storing a fixed number of significant digits can reduce the number of bits and/or the amount of memory required to represent a particular data point. The user can provide information indicative of a time interval for which a particular set of process data points can be analyzed. For example, the user can provide an indication that data be analyzed and/or stored at intervals spaced no more frequently than a predetermined number of seconds.

At activity 3350, certain exemplary embodiments can comprise calculating a deviation measure. The deviation measure can be a distance of a point comprised in the raw set of data to a line defined by a pair of opposing end points comprised in the raw set of data. The two points defining the line can be an opposing pair of endpoints. In the raw data set, a first point and a third point can be an opposing pair of endpoints. A second data point can be a point for which a deviation measure is calculated.

At activity 3400, certain exemplary embodiments can comprise storing the deviation measure. The deviation measure can be stored on the memory device. The deviation measure can be storable in a table and/or database.

At activity 3450, certain exemplary embodiments can comprise comparing the deviation measure to the deviation metric. The comparison between the deviation measure and the deviation metric can be made by a processor in an information device. The comparison between the deviation measure and the deviation metric can provide a basis for deleting data points from the raw data set if the deviation measure for each of those data points is less than the deviation metric.

At activity 3500, certain exemplary embodiments can comprise changing an endpoint. If the deviation metric is less than the deviation measure, an information device can determine that the data point for which the deviation measure is calculated is not close enough to a line formed between two endpoints. The information device can redefine the opposing pair of endpoints to comprise the data point for which the deviation is calculated or a simulated data point calculable therefrom.

At activity 3550, certain exemplary embodiments can comprise deleting data points. A data point can be deleted when the deviation measure related to the data point is less than the deviation metric. After deletion, the data point can be estimated via linear interpolation between stored data points.

At activity 3600, certain exemplary embodiments can comprise storing data points. In certain exemplary embodiments, the opposing pair of end points can be stored in a compressed set at least partially representative of the raw set. The compressed set can be stored in a third Oracle table on the memory device. In certain exemplary embodiments, the third Oracle table can be an index organized table. Data points can be stored responsive to comparing deviation measures to the deviation metric. Deviation measures can be calculated between opposing end points. The opposing end points can be stored. Points deleted between the opposing end points can be calculated and approximated via linear interpolation between the opposing endpoints. Data points can be stored, for example, in an Oracle table on the memory device.

At activity 3650, certain exemplary embodiments can comprise compressing a time stamp. Compressing the time stamp can comprise replacing a single time stamp field with a first time stamp field and a second time stamp field. In certain exemplary embodiments, replacing a single time stamp field with two fields can reduce the number of bits required to store equivalent time stamp information. The first time stamp field can comprise information indicative of a year, month, day, and/or 8 hour period, etc. for a 30 year time span starting at a configurable year. The second time stamp field can comprise an hour, minute and/or second within an 8 hour time period, etc.

At activity 3700, certain exemplary embodiments can comprise compressing a database key. The database key can be compressed by storing portions of a primary key column value in an index or index-organized table, which can reduce the storage overhead of repeated values. Keys in an index can have two parts, a first part adaptable to group the key, and a second part adapted to be unique. In certain exemplary embodiments, the key can be provided by database software such as software provided by the Oracle Corporation. The key can be provided in the form of an identifier of a row appended to a grouping piece. Key compression can comprise breaking off the grouping piece and storing it so it can be shared by multiple unique pieces.

Figure 4:
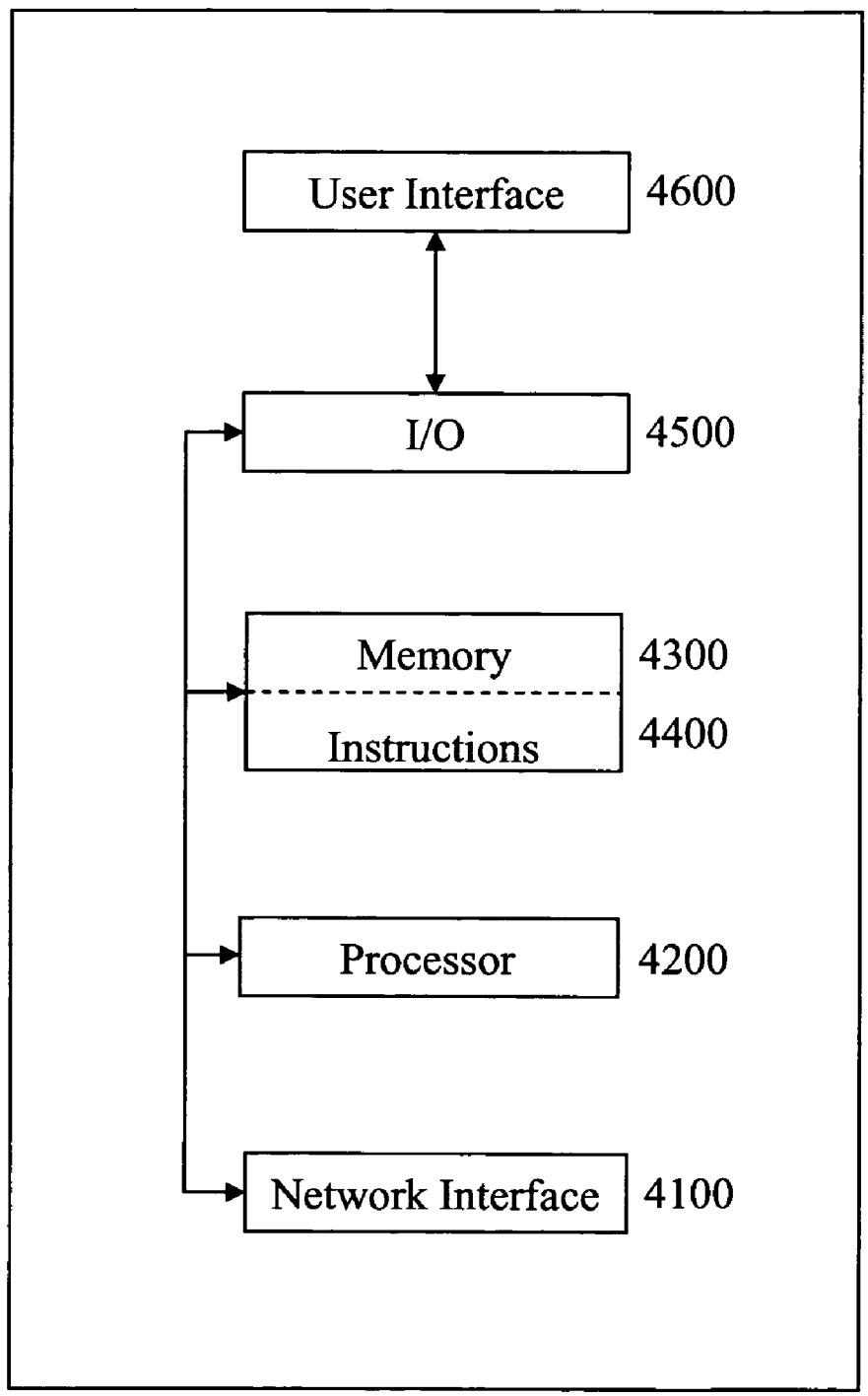
FIG. 4 is a block diagram of an exemplary embodiment of an information device 4000.

FIG. 4 is a block diagram of an exemplary embodiment of an information device 4000, which in certain operative embodiments can comprise, for example, information device 1400 and/or information device 1600 of FIG. 1. Information device 4000 can comprise any of numerous well-known components, such as for example, one or more network interfaces 4100, one or more processors 4200, one or more memories 4300 containing instructions 4400, one or more input/output (I/O) devices 4500, and/or one or more user interfaces 4600 coupled to I/O device 4500, etc.

In certain exemplary embodiments, via one or more user interfaces 4600, such as a browser window, a user can view a schematic representation of a process. The user can view updatable process data in real time and/or receive alerts responsive to varying process conditions.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of the appended claims. For example, regardless of the content of any portion (e.g., title, field, background, summary, abstract, drawing figure, etc.) of this application, unless clearly specified to the contrary, there is no requirement for the inclusion in any claim of the application of any particular described or illustrated activity or element, any particular sequence of such activities, or any particular interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. Accordingly, the descriptions and drawings are to be regarded as illustrative in nature, and not as restrictive. Moreover, when any number or range is described herein, unless clearly stated otherwise, that number or range is approximate. When any range is described herein, unless clearly stated otherwise, that range includes all values therein and all subranges therein. Any information in any material (e.g., a United States patent, United States patent application, book, article, etc.) that has been incorporated by reference herein, is only incorporated by reference to the extent that no conflict exists between such information and the other statements and drawings set forth herein. In the event of such conflict, including a conflict that would render a claim invalid, then any such conflicting information in such incorporated by reference material is specifically not incorporated by reference herein.

What is claimed is:

1. A method for transforming a raw set of electrical power generation process data associated with a first physical storage space into a representation of the raw set, the representation associated with a second physical storage space that is smaller than the first physical storage space, the method comprising:
    receiving a non-zero user-specified deviation metric related to the raw set of electrical power generation process data;
    receiving the raw set of electrical power generation process data, the raw set comprising at least three data points;

automatically defining a first artificial data point by adding the non-zero user-specified deviation metric to an ordinal value of a second data point;

automatically defining a second artificial data point by subtracting the non-zero user-specified deviation metric from an ordinal value of a third data point;

automatically calculating a first connecting line slope, the first connecting line defined by a first data point and the first artificial data point;

automatically calculating a second connecting line slope, the second connecting line defined by the first data point and the second artificial data point; and if the second connecting line slope is greater than the first connecting line slope, automatically causing a point related to the third data point to be stored in a compressed set at least partially representative of the raw set, the compressed set stored in an Oracle table on a memory device.

2. The method of claim 1, further comprising:

automatically defining a third artificial data point by subtracting the non-zero user-specified deviation metric from an ordinal value of the second data point;

automatically defining a fourth artificial data point by adding the non-zero user-specified deviation metric to an ordinal value of the third data point;

automatically calculating a third connecting line slope, the third connecting line defined by the first data point and the third artificial data point;

automatically calculating a fourth connecting line slope, the fourth connecting line defined by the first data point and the fourth artificial data point; and if the third connecting line slope is greater than the fourth connecting line slope, causing a point related to the third data point to be stored in a compressed set at least partially representative of the raw set, the compressed set stored in an Oracle table on a memory device.

3. The method of claim 1, further comprising:

automatically rendering the first data point and the second data point to a user via an I/O device.

4. The method of claim 1, further comprising:

automatically deleting the second data point.

5. The method of claim 1, further comprising:

automatically replacing the third data point with a simulated data point related to at least one of the first data point, the second data point, and the third data point.

6. The method of claim 1, further comprising:

automatically storing the first data point in a compressed set at least partially representative of the raw set, the compressed set stored in an Oracle table on a memory device.

7. The method of claim 1, wherein the raw set of electrical power generation process data comprises sequential data.

8. A method transforming a raw set of electrical power generation process data associated with a first physical storage space into a representation of the raw set, the representation associated with a second physical storage space that is smaller than the first physical storage space, the method comprising:

receiving a non-zero user-specified deviation metric relating to the raw set of electrical power generation process data;

automatically calculating a deviation measure of at least three data points from the raw set, the at least three data points comprising an opposing pair of end points;

automatically comparing the deviation measure to the deviation metric;

if the deviation measure does not exceed the deviation metric, automatically deleting all data points intermediate to the opposing pair of end points; and automatically storing the opposing pair of end points in a compressed set at least partially representative of the raw set, the compressed set stored in a third Oracle table on a memory device.

9. The method of claim 8, further comprising:

automatically storing the deviation measure on a memory device.

10. The method of claim 8, further comprising:

receiving the raw set of electrical power generation process data points.

11. The method of claim 8, further comprising:

storing the raw set of electrical power generation process data points in a first Oracle table on a memory device.

12. The method of claim 8, further comprising:

receiving the raw set of electrical power generation process data points from a first Oracle table on a memory device.

13. The method of claim 8, further comprising:

calculating at least one statistical parameter for the raw set of electrical power generation process data points; and storing the statistical parameter in a second Oracle table on a memory device.

14. The method of claim 8, further comprising:

automatically changing at least one end point when the deviation measure is greater than the deviation metric.

15. The method of claim 8, further comprising:

preprocessing the raw set via adding artificial data points to said raw set of electrical power generation process data points.

16. The method of claim 8, further comprising:

compressing at least one database key via removing a portion of the key.

17. The method of claim 8, wherein said third Oracle table is an index organized table.

18. The method of claim 8, further comprising:

compressing information indicative of a time related to the raw set, after said compression the information indicative of a time comprising;

a first field comprising a relative indicator of a year and a day related to the raw set; and a second field comprising an indicator of an hour and a minute and a second related to the raw set.

19. The method of claim 8, further comprising:

receiving, from a user, information indicative of a minimum acceptable time between successively stored data points in the raw set of electrical power generation process data points.

20. The method of claim 8, further comprising:

receiving, from a user, information indicative of a number of significant digits storable for a particular data point in the raw set of electrical power generation process data points.

21. The method of claim 8, further comprising:

calculating at least one statistical parameter related to the raw set of electrical power generation process data points, the at least one statistical parameter comprising an average.

22. The method of claim 8, further comprising:

calculating at least one statistical parameter related to the raw set of electrical power generation process data points, the at least one statistical parameter comprising a maximum value.

23. The method of claim 8, further comprising:
calculating at least one statistical parameter related to the raw set of electrical power generation process data points, the at least one statistical parameter comprising a minimum value.

24. The method of claim 8, further comprising:
calculating at least one statistical parameter related to the raw set of electrical power generation process data points, the at least one statistical parameter comprising an integral value.

25. A system for transforming a raw set of electrical power generation process data associated with a first physical storage space into a representation of the raw set, the representation associated with a second physical storage space that is smaller than the first physical storage space, the system comprising:
   a deviation metric processor adapted to receive a non-zero user-specified deviation metric relating to the raw set of electrical power generation process data;
   a deviation processor adapted to automatically calculate a deviation measure of at least three data points from the raw set, said at least three data points comprising an opposing pair of end points;
   a measurement processor adapted to automatically compare the deviation measure to the deviation metric;
   a deletion processor adapted to, if the deviation measure does not exceed the deviation metric, automatically delete all data points intermediate to the opposing pair of end points; and
   a storage processor adapted to automatically store the opposing pair of end points in an Oracle table on a memory device.

26. A machine-readable medium storing instructions for transforming a set of electrical power generation process data associated with a first physical storage space into a representation of the raw set, the representation associated with a second physical storage space that is smaller than the first physical storage space, the machine-readable medium comprising stored instructions for:
   receiving a non-zero user-specified deviation metric relating to the raw set of electrical power generation process data;
   automatically calculating a deviation measure of at least three data points from the raw set, said at least three data points comprising an opposing pair of end points;
   automatically comparing the deviation measure to the deviation metric;
   if the deviation measure does not exceed the deviation metric, automatically deleting all data points intermediate to the opposing pair of end points; and
   automatically storing the opposing pair of end points in a compressed set at least partially representative of the raw set, the compressed set stored in a third Oracle table on a memory device.

* * * * *